United States Patent
Macropoulos et al.

(10) Patent No.: US 7,471,146 B2
(45) Date of Patent: Dec. 30, 2008

(54) OPTIMIZED CIRCUITS FOR THREE DIMENSIONAL PACKAGING AND METHODS OF MANUFACTURE THEREFORE

(75) Inventors: William Macropoulos, Norfolk, MA (US); Greg Mendolia, Nashua, NH (US); James G. Oakes, Sudbury, MA (US); Izz Khayo, Nashua, NH (US)

(73) Assignee: Paratek Microwave, Inc., Columbia, MO (US)

( * ) Notice: Subject to any disclaimer, the term of this patent is extended or adjusted under 35 U.S.C. 154(b) by 303 days.

(21) Appl. No.: 11/353,930

(22) Filed: Feb. 14, 2006

(65) Prior Publication Data

US 2006/0214165 A1    Sep. 28, 2006

Related U.S. Application Data

(60) Provisional application No. 60/653,162, filed on Feb. 15, 2005.

(51) Int. Cl.
  *H03G 3/00*  (2006.01)
  *H03G 3/20*  (2006.01)

(52) U.S. Cl. .................. 330/127; 330/126; 330/250; 455/333; 455/334; 455/341; 257/499; 257/500; 438/6; 438/26

(58) Field of Classification Search ......... 455/333–341; 330/126, 127, 250; 257/499–530; 438/6, 438/26
See application file for complete search history.

(56) References Cited

U.S. PATENT DOCUMENTS

| | | | |
|---|---|---|---|
| 5,312,790 A | 5/1994 | Sengupta et al. | 501/137 |
| 5,427,988 A | 6/1995 | Sengupta et al. | 501/137 |
| 5,486,491 A | 1/1996 | Sengupta et al. | 501/137 |
| 5,593,495 A | 1/1997 | Masuda et al. | 117/4 |
| 5,635,433 A | 6/1997 | Sengupta | 501/137 |
| 5,635,434 A | 6/1997 | Sengupta | 501/138 |
| 5,640,042 A | 6/1997 | Koscica et al. | 257/595 |
| 5,693,429 A | 12/1997 | Sengupat et al. | 428/699 |
| 5,694,134 A | 12/1997 | Barnes | 343/700 |
| 5,766,697 A | 6/1998 | Sengupta et al. | 427/585 |
| 5,830,591 A | 11/1998 | Sengupta et al. | 428/701 |
| 5,846,893 A | 12/1998 | Sengupta et al. | 501/137 |
| 5,886,867 A | 3/1999 | Chivukula et al. | 361/311 |
| 5,990,766 A | 11/1999 | Zhang et al. | 333/205 |
| 6,074,971 A | 6/2000 | Chiu et al. | 501/139 |
| 6,377,142 B1 | 4/2002 | Chiu et al. | 333/238 |
| 6,377,217 B1 | 4/2002 | Zhu et al. | 343/700 |
| 6,377,440 B1 | 4/2002 | Zhu et al. | 361/311 |

(Continued)

OTHER PUBLICATIONS

Gordon Gray, "Enabling Cost Effective Integration Through Package Stacking", Jan. 17-19, 2006, IWPC.

*Primary Examiner*—Jack Chiang
*Assistant Examiner*—Nghia M Doan
(74) *Attorney, Agent, or Firm*—James S. Finn, Esq.

(57) ABSTRACT

An embodiment of the present invention provides an apparatus, comprising an integrated circuit, wherein a first portion of the integrated circuit is placed on a top tier substrate and a second portion of the integrated circuit is placed on a bottom tier substrate stacked adjacent the top tier substrate and wherein the first portion and the second portion of the integrated circuit are interconnected; and printed spiral arms stacked vertically on both the top and bottom surface of the top tier substrate thereby creating high Q inductors.

16 Claims, 3 Drawing Sheets

U.S. PATENT DOCUMENTS

| | | | |
|---|---|---|---|
| 6,404,614 B1 | 6/2002 | Zhu et al. | 361/277 |
| 6,492,883 B2 | 12/2002 | Liang et al. | 333/132 |
| 6,514,895 B1 | 2/2003 | Chiu et al. | 501/137 |
| 6,525,630 B1 | 2/2003 | Zhu et al. | 333/205 |
| 6,531,936 B1 | 3/2003 | Chiu et al. | 333/164 |
| 6,535,076 B2 | 3/2003 | Partridge et al. | 333/17.1 |
| 6,538,603 B1 | 3/2003 | Chen et al. | 342/372 |
| 6,556,102 B1 | 4/2003 | Sengupta et al. | 333/161 |
| 6,590,468 B2 | 7/2003 | du Toit et al. | 333/17.3 |
| 6,597,265 B2 | 7/2003 | Liang et al. | 333/204 |
| 6,914,480 B2 * | 7/2005 | Arai et al. | 330/126 |
| 6,977,546 B2 * | 12/2005 | Stapleton | 330/10 |
| 6,985,712 B2 * | 1/2006 | Yamakawa et al. | 455/333 |
| 7,305,223 B2 * | 12/2007 | Liu et al. | 455/333 |
| 7,418,251 B2 * | 8/2008 | Liu | 455/333 |

* cited by examiner

_US 7,471,146 B2_

OPTIMIZED CIRCUITS FOR THREE DIMENSIONAL PACKAGING AND METHODS OF MANUFACTURE THEREFORE

CROSS-REFERENCE TO RELATED APPLICATION

This application claims the benefit of priority under 35 U.S.C Section 119 from U.S. Provisional Application Ser. No. 60/653,162, filed Feb. 15, 2005, entitled, "Wireless RF Circuitry Optimized for 3D Packaging Technologies."

BACKGROUND OF THE INVENTION

Packaging technology for Power Amplifier modules and Front Ends, particularly those employed in modern wireless communication networks, is moving towards a more compact and low cost packaging technology, and hence wireless circuitry must be modified and designed around the strengths of this technology.

Often circuitry, in particular, but not limited to, wireless circuitry, occupies relatively large and expensive real estate on a module board. Thus, there is a strong for technologies with improved designs which can reduce the size and thus the cost of these module boards.

SUMMARY OF THE INVENTION

An embodiment of the present invention provides an apparatus, comprising an integrated circuit, wherein a first portion of the integrated circuit may be placed on a first substrate and a second portion of the integrated circuit may be placed on a second substrate stacked adjacent the first substrate and wherein the first portion and the second portion of the integrated circuit may be interconnected. The first substrate may be comprised of low dielectric material and the distance between the first and the second substrate may be sufficiently large to facilitate high impedance functions and components. In an embodiment of the present invention, the integrated circuit may further comprise printing inductors on the first substrate thereby enabling them to be high Q inductors and printed spiral arms may be stacked vertically on both the top and bottom surface of the first substrate thereby creating high Q inductors.

Another embodiment of the present invention provides a method, comprising placing a first portion of an integrated circuit on a first substrate, placing a second portion of an integrated circuit on a second substrate that stacked adjacent the first substrate, and interconnecting the first portion and the second portion of the integrated circuit. The present method may further comprise placing the first and the second substrate at a predetermined distance that enables high impedance functions and components and stacking printed spiral arms vertically on both the top and bottom surface of the first substrate thereby creating high Q inductors. The present method may also comprise placing critical and difficult to design RF functions and building blocks on the first substrate due to ease of access and using distinct dielectric constants with different heights from a ground plane by the first and the second substrates associated with the first and second portions of the circuit.

Another embodiment of the present invention further provides an integrated circuit, comprising a first portion including at least one output match connected to at least one harmonic filter on a first substrate, a second portion on a second substrate positioned adjacent the first substrate and including at least one power amplifier connected to at least one bias and power controller which is further connected to an antenna switch and wherein the first and second substrates further comprise at least one interconnect connecting the first portion and the second portion.

BRIEF DESCRIPTION OF THE DRAWINGS

The present invention is described with reference to the accompanying drawings. In the drawings, like reference numbers indicate identical or functionally similar elements. Additionally, the left-most digit(s) of a reference number identifies the drawing in which the reference number first appears.

DESCRIPTION OF THE PREFERRED EMBODIMENT

Figure 1:
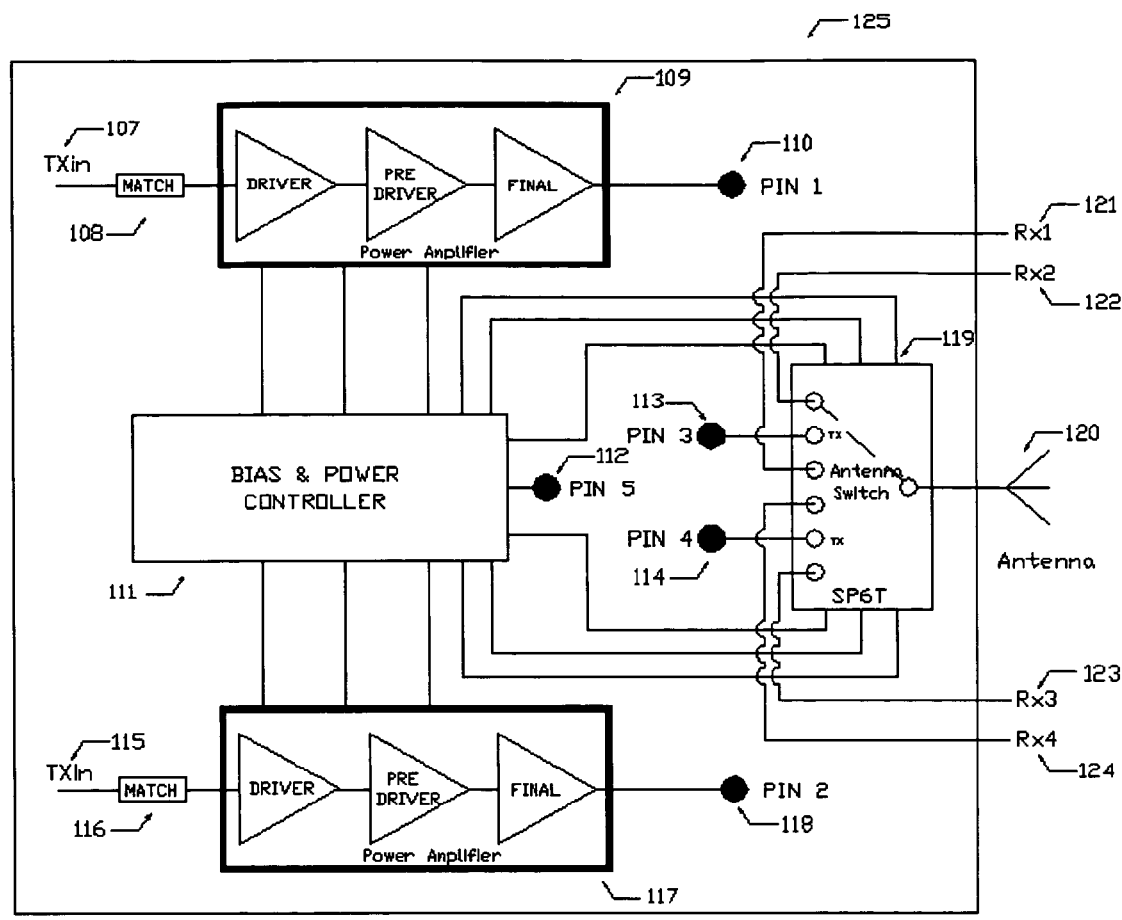
FIG. 1 illustrates a circuit block diagram for the bottom tier of the 3D stackable substrate of one embodiment of the present invention.

Although the present invention is not limited to only RF circuits, current design approaches for RF circuits designed for markets such as wireless products all use a single substrate onto which all components and traces are placed on. Although the substrates may have multi-layers of conductors, there is only one layer available to place components during the creation of a multi-chip module (MCM). This not only limits the size reduction, but RF performance is limited due to the sharing of one common substrate. Some components and functions work best on high impedance substrates that are thick, low dielectric constant and low loss. Other components prefer low impedance substrates that are thin and high dielectric.

Further, on conventional 2D package designs, it is extremely difficult to print high Q inductors. In an embodiment of the present invention, the multiple levels of the present 3D approach allows the construction of inductors with spirals above each other in a stacked fashion, which increases Q substantially.

Although methods for designing wireless RF circuitry on the 3D packaging technologies are described herein, it is understood that the present invention is not limited to any particular circuit (such as RF) or any particular packaging structure. Often wireless circuitry occupies relatively large and expensive real estate on the module board. By applying certain design topologies on the 3D packages such as stackable substrates, we can efficiently reduce the size and thus the cost of these modules. The 3D approach for circuit design has many advantages; it reduces the area that a typical circuit occupies by simplifying the routing and the tuning of the circuits as illustrated herein. More specifically, but not by way of limitation, it is critical to strategically partition the circuit in regards to what is placed on a lower substrate and what is placed on an upper substrate(s). Careful selection of the functions and components on each level allows the minimization of the number of interconnects needed in the z-axis between levels. Minimization of z-axis connections/routing saves board space (each connection utilizes a finite area), minimizes loss (interconnects typically have greater loss (due to dissimilar materials, discontinuities and impedance variations) as compared to x- or y-axis connections that can be made with simple printed traces on the substrate) and reduces cost (smaller boards required, less interconnect hardware such as solder balls or SMD components). The 3D stackable substrate also provides additional levels for the dies and other components to be mounted on as well.

The 3D stackable approach for RF circuitry has many RF advantages; it permits the lower substrate to be very thin, and hence provides a better thermal dissipation and better thermal stability for the Power Amplifiers, as well as a better RF ground. This is only possible since the upper levels of the 3D stackable substrates can be utilized for the matching networks, filters and other passive networks that are sensitive to the substrate thickness and prefer high impedance/low dielectric substrates. Although not limited in this respect, one potential stacking of substrates and partitioning of circuits is as follows:

1. Thin bottom substrate with high dielectric constant
2. Air gap, later filled with low dielectric overmold compound when the multi-chip 3D module is encapsulated in the packaging process
3. Thin top substrate with low dielectric constant (components on the top substrate and the substrate itself will later also be covered with low dielectric overmold compound when the multi-chip 3D module is encapsulated in the packaging process An embodiment of the present invention provides that the partitioning between the top and bottom substrate for a mobile phone radio transmitter may be as follows: The bottom substrate may contain two power amplifiers, (one for both high bands and one for both low bands) a CMOS Power and Bias Controller, and a single pole six throw antenna switch. The top substrate may contain two output matching networks, two couplers, and harmonic filters. The major advantages of this partitioning strategy are as follows:

1. This partitioning minimizes the number of connections in the z-axis between the two stacked substrates, thus saving space, reducing part count (interconnect components), reducing cost and increasing reliability.
2. Most components and functions requiring a high impedance substrate are placed on the top substrate. The top substrate can not only be chosen to be a low dielectric material (for high impedance), but the air gap (later in the process filled with a very low dielectric overmold material, typically a plastic material) may be very low in dielectric constant so the overall effective dielectric of the top substrate may be very low, and its height may be relatively large, also facilitating high impedance functions and components.
3. High Q inductors may be realized by printing inductors on the top substrate. Even higher Q inductors are possible by printing spiral arms stacked vertically, on both top and bottom surface of the top substrate, or on 3 surfaces—both surfaces of the top substrate and the top surface of the bottom substrate. The construction of high Q inductors allows the design of amplifiers and filters with significantly improved performance, especially when designing to maximize output power and efficiency (minimize loss).
4. Critical or hard to design RF functions and building blocks such as the power amplifier output match network may be located on the top substrate. This enables simple and rapid tuning of these circuits as design engineers iteratively and empirically "tune" their designs to optimize performance. If these functions were placed in the lower layers, access would be impossible once the stacked substrates were assembled. The entire output matching network does not need to be placed on the top substrate—if desired, only the portion that is critical and will likely need to be tuned can be placed on the top substrate, although the present invention is not limited in this respect. Also, other 2D packaging technologies such as lead-frame are equally difficult to tune, although lead-frame is one of the lowest cost options for substrates and packaging. As an additional embodiment, one could use a lead-frame based substrate for the lower substrate to reduce cost, and still have the flexibility to tune circuits and components by stacking a rigid or flex substrate as the second substrate on top of the bottom lead-frame substrate.

Although detailed descriptions of one partitioning is given in the next section, it is understood that this is merely an illustrative embodiment and is only one of numerous partitioning techniques to give these RF benefits as other divisions of functions and components may also capitalize on the high impedance (low dielectric/increased height) of the top substrate(s) and low impedance (high dielectric/decreased height) of the lower substrate(s).

Turning now to the figures, FIG. 1 illustrates an example block diagram of wireless circuitry that can be utilized in the bottom tier of the 3D Stackable Substrate of an embodiment of the present invention. Although the present invention is not limited in this respect, FIG. 1 shows an RF block diagram made up of two Power Amplifiers 109 and 117, that are connected to the top tier of the 3D Stackable Substrate (shown in FIG. 3) through PIN 1 (110 of FIG. 1 and 340 of FIG. 3) and PIN 2 (118 of FIG. 1 and 346 of FIG. 3) respectively, the bottom tier has a CMOS Power and Bias Controller 111 which receives its coupled input power from the top tier shown in FIG. 3 through PIN 5 (112 of FIG. 1 and 345 of FIG. 3). FIG. 1 may also include a single pole six throw antenna switch 119 with four receive outputs 121, 122, 123 and 124 that receives Tx signals 107 and 115 through match 108 and 116 from the top substrate shown on FIG. 3 via PIN 3 (113 of FIG. 1 and 344 of FIG. 3) and PIN 4 (114 of FIG. 1 and 350 of FIG. 3) respectively. The antenna port of the switch may go directly to the external antenna 247. In an embodiment of the present invention, the bottom tier thickness may not be restricted to any height since most of the tuning networks are on the top tier of the 3D Stackable Substrate shown in FIG. 3.

Figure 2:
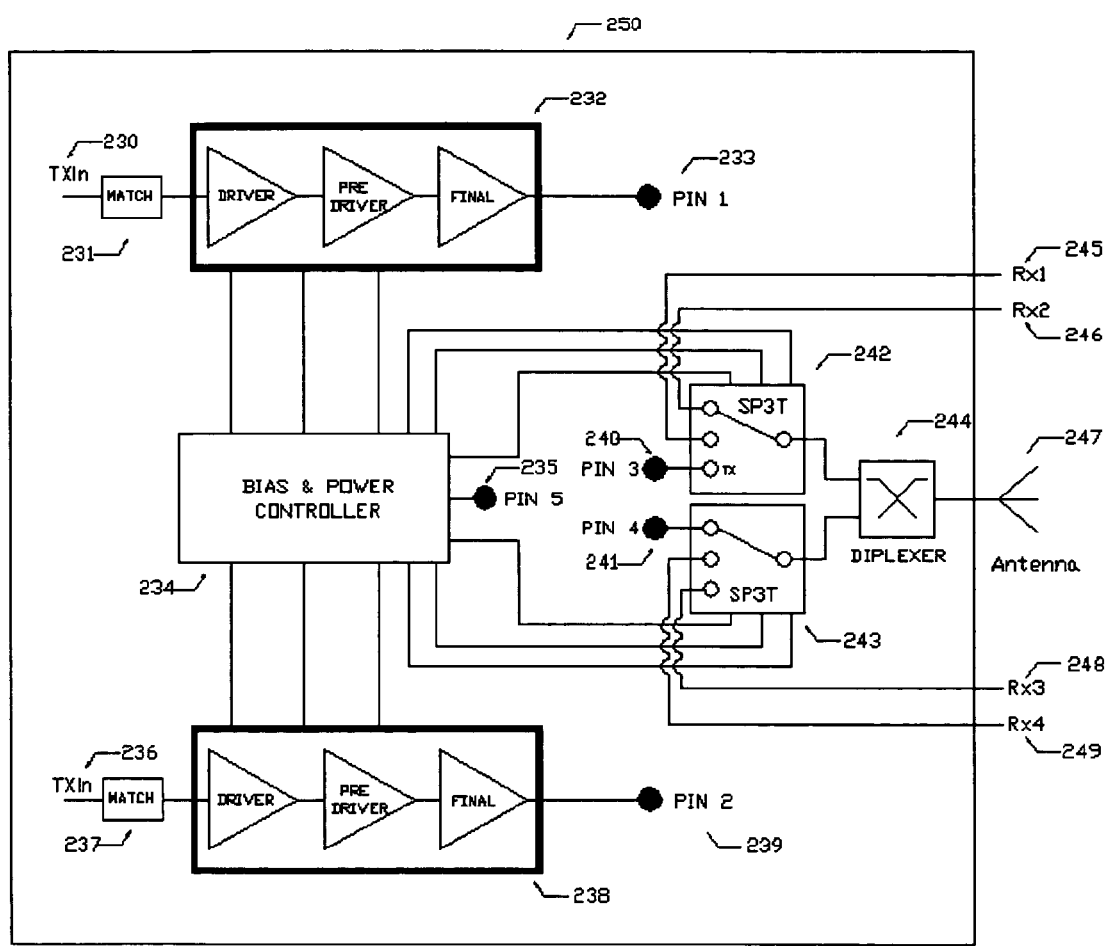
FIG. 2 illustrates an alternative circuit block diagram for the bottom tier of the 3D stackable substrate of one embodiment of the present invention.

Turning now to FIG. 2 is an illustration of an alternative circuit block diagram of wireless circuitry that can be utilized in the bottom tier of the 3D Stackable Substrate of one embodiment of the present invention. FIG. 2 shows an RF block diagram made up of two Power Amplifiers 232 and 238, that are connected to the top tier of the 3D Stackable Substrate shown in FIG. 3 through PIN 1 (233 of FIG. 2 and 340 of FIG. 3) and PIN 2 (239 of FIG. 2 and 346 of FIG. 3) respectively, the bottom tier may have a CMOS Power and Bias Controller 234 which receives its coupled input power from the top tier shown in FIG. 3 through PIN 5 (235 if FIG. 2 and 345 of FIG. 3). FIG. 2 also includes, in an embodiment of the present invention, two single pole three throw switches 242 and 243 with four receive outputs 245, 246, 248 and 249 that receives Tx signals 230 and 236 via match 231 and 237 from the top substrate shown on FIG. 3 via PIN 3 (240 of FIG. 2 and 344 of FIG. 3) and PIN 4 (241 of FIG. 2 and 350 of FIG. 3) respectively. The Antenna ports of the switches may go through the diplexer 244 to the external antenna port 247. The bottom tier thickness is not restricted to any height since most of the tuning networks are on the top tier of the 3D Stackable Substrate shown in FIG. 3.

Figure 3:
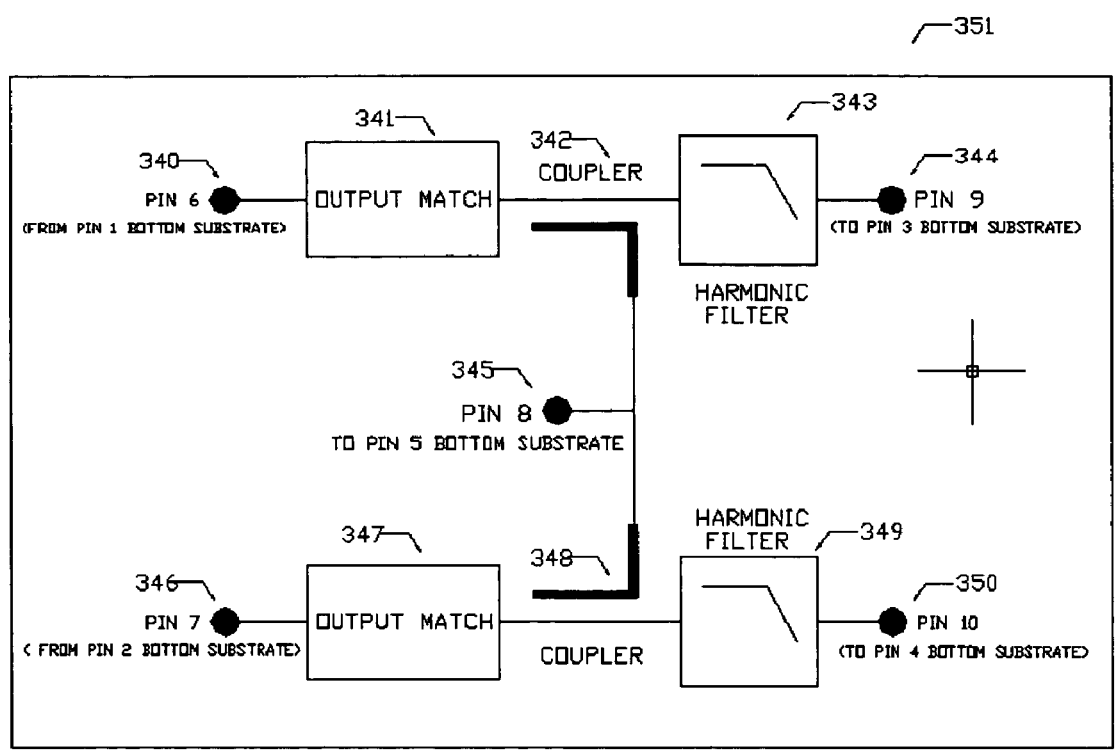
FIG. 3 illustrates a circuit block diagram for the top tier of the 3D stackable substrate of one embodiment of the present invention.

FIG. 3 demonstrates a circuit block diagram of wireless circuitry that can be utilized in the top tier of the 3D Stackable Substrate in an embodiment of the present invention. FIG. 3 shows two output matching networks 341 and 347 that are connected to the lower tier via PIN 6 340 and PIN 7 346 respectively. The FIG. 3 circuit block diagram may also include two couplers 342 and 348 that are connected to the lower tier via PIN 8 345. The harmonic filters 343 and 349 may be connected to the lower tier through 344 and 350 respectively.

While the present invention has been described in terms of what are at present believed to be its preferred embodiments, those skilled in the art will recognize that various modifications to the disclose embodiments can be made without departing from the scope of the invention as defined by the following claims.

What is claimed:

1. An apparatus, comprising:
    an integrated circuit, wherein a first portion of said integrated circuit is placed on a top tier substrate and a second portion of said integrated circuit is placed on a bottom tier substrate stacked adjacent said top tier substrate and wherein said first portion and said second portion of said integrated circuit are interconnected; and
    printed spiral arms stacked vertically on both the top and bottom surface of said top tier substrate thereby creating high Q inductors;
    wherein said first portion of said integrated circuit includes at least the following components:
    at least one output match;
    at least one harmonic filter; and
    at least one interconnect to said second portion of said integrated circuit on said second substrate; and
    wherein said second portion of said integrated circuit includes at least the following components:
    at least one power amplifier;
    at least one bias and power controller connected to said at least one power amplifier;
    at least one antenna switch connected to said at least one bias and power controller; and
    at least one interconnect to said first portion of said integrated circuit.

2. The apparatus of claim 1, wherein said top tier substrate is comprised of low dielectric material.

3. The apparatus of claim 2, wherein a distance between said top tier and said bottom tier substrate is sufficiently large to facilitate high impedance functions and components.

4. The apparatus of claim 2, further comprising printing inductors on said top tier substrate thereby enabling them to be high Q inductors.

5. The apparatus of claim 1, wherein said high Q inductor is further connected to the top surface of said bottom tier substrate.

6. The apparatus of claim 1, wherein critical and difficult to design RF functions and building blocks are placed on said top tier substrate due to ease of access.

7. The apparatus of claim 1, wherein said top tier and said bottom tier substrates have distinct dielectric constants with different heights from a ground plane associated with said first-and second portions of said circuit.

8. The apparatus of claim 1, further comprising placing components and functions on the top tier and bottom tier substrates so as to minimize z-axis interconnects and maximize performance.

9. The apparatus of claim 1, further comprising placing components and functions on the top tier and bottom tier substrates to maximize the ability to tune critical parts of said circuit.

10. The apparatus of claim 1, wherein said second portion of said integrated circuit includes at least the following components:
    at least one power amplifier;
    at least one bias and power controller connected to said at least one power amplifier;
    at least two antenna switches connected to said at least one bias and power controller and further connected to an antenna via a diplexer; and
    at least one interconnect to said first portion of said integrated circuit.

11. A method, comprising:
    placing a first portion of said integrated circuit on a top tier substrate;
    placing a second portion of an integrated circuit on a bottom tier substrate that stacked adjacent said top tier substrate;
    stacking printed spiral arms vertically on both the top and bottom surface of said top tier substrate thereby creating high Q inductors; and
    interconnecting said first portion and said second portion of said integrated circuit;
    wherein said first portion of said integrated circuit includes at least the following components:
    at least one output match;
    at least one harmonic filter; and
    at least one interconnect to said second portion of said integrated circuit on said second substrate; and
    wherein said second portion of said integrated circuit includes at least the following components:
    at least one power amplifier;
    at least one bias and power controller connected to said at least one power amplifier;
    at least one antenna switch connected to said at least one bias and power controller; and
    at least one interconnect to said first portion of said integrated circuit.

12. The method of claim 11, further comprising placing said top tier and said bottom tier substrate at a predetermined distance that enables high impedance functions and components.

13. The method of claim 12, further comprising using distinct dielectric constants with different heights from a ground plane by said top tier and said bottom tier substrates associated with said first and second portions of said circuit.

14. The method of claim 11, further comprising placing critical and difficult to design RF functions and building blocks on said top tier substrate due to ease of access.

15. The method of claim 11, further comprising placing components and functions on the top tier and bottom tier substrates to minimize z-axis interconnects and maximize performance.

16. The method of claim 11, further comprising placing at least the following components on said second portion of said integrated circuit:
    at least one power amplifier;
    at least one bias and power controller connected to said at least one power amplifier;
    at least two antenna switches connected to said at least one bias and power controller and further connected to an antenna via a diplexer; and
    at least one interconnect to said first portion of said integrated circuit on said first substrate.

* * * * *